(12) United States Patent
Oyamada

(10) Patent No.: US 8,987,774 B2
(45) Date of Patent: Mar. 24, 2015

(54) SEMICONDUCTOR LIGHT-EMITTING DEVICE AND PRODUCING METHOD THEREOF

(71) Applicants: Citizen Holdings Co., Ltd., Tokyo (JP); Citizen Electronics Co., Ltd., Yamanashi (JP)

(72) Inventor: Nodoka Oyamada, Yamanashi (JP)

(73) Assignees: Citizen Holdings Co., Ltd., Tokyo (JP); Citizen Electrinocs Co., Ltd., Yamanashi (JP)

( * ) Notice: Subject to any disclaimer, the term of this patent is extended or adjusted under 35 U.S.C. 154(b) by 0 days.

(21) Appl. No.: 14/076,176

(22) Filed: Nov. 9, 2013

(65) Prior Publication Data

US 2014/0138725 A1    May 22, 2014

(30) Foreign Application Priority Data

Nov. 12, 2012 (JP) .................. 2012-248242

(51) Int. Cl.
*H01L 33/00* (2010.01)
*H01L 33/50* (2010.01)
*H01L 33/56* (2010.01)

(52) U.S. Cl.
CPC .............. *H01L 33/505* (2013.01); *H01L 33/56* (2013.01)
USPC ........................................... 257/99; 257/100

(58) Field of Classification Search
USPC ................................................... 257/99, 100
See application file for complete search history.

(56) References Cited

U.S. PATENT DOCUMENTS

| 2011/0210311 A1* | 9/2011 | Kim et al. ........................ 257/13 |
| 2012/0112227 A1* | 5/2012 | Toyama ........................... 257/98 |
| 2013/0029439 A1* | 1/2013 | Song et al. ...................... 438/27 |
| 2014/0021503 A1* | 1/2014 | Yoshida et al. ................. 257/98 |

FOREIGN PATENT DOCUMENTS

| JP | 2010-141176 A | 6/2010 |
| JP | 2012-227470 A | 11/2012 |

* cited by examiner

Primary Examiner — Ngan Ngo

(57) ABSTRACT

An object of the present invention is to provide an LED device that can achieve a large total luminance flux while also achieving a structure, using a phosphor sheet, that is compact in size and easy to produce and whose color emission is easy to manage, and a method for producing such an LED device. A semiconductor light-emitting device including a semiconductor light-emitting element which includes a transparent insulating substrate and a semiconductor layer formed on a lower surface of the transparent insulating substrate, a phosphor resin which covers a side face of the transparent insulating substrate, and which wavelength-converts a portion of light emitted from the semiconductor light-emitting element, and a phosphor sheet which covers an upper surface of the phosphor resin and is bonded to the transparent insulating substrate, wherein the phosphor sheet has a top plan shape that is identical with an outer peripheral shape of the phosphor resin, and the top plan shape of the phosphor sheet defines an overall outer plan shape of the device.

7 Claims, 7 Drawing Sheets

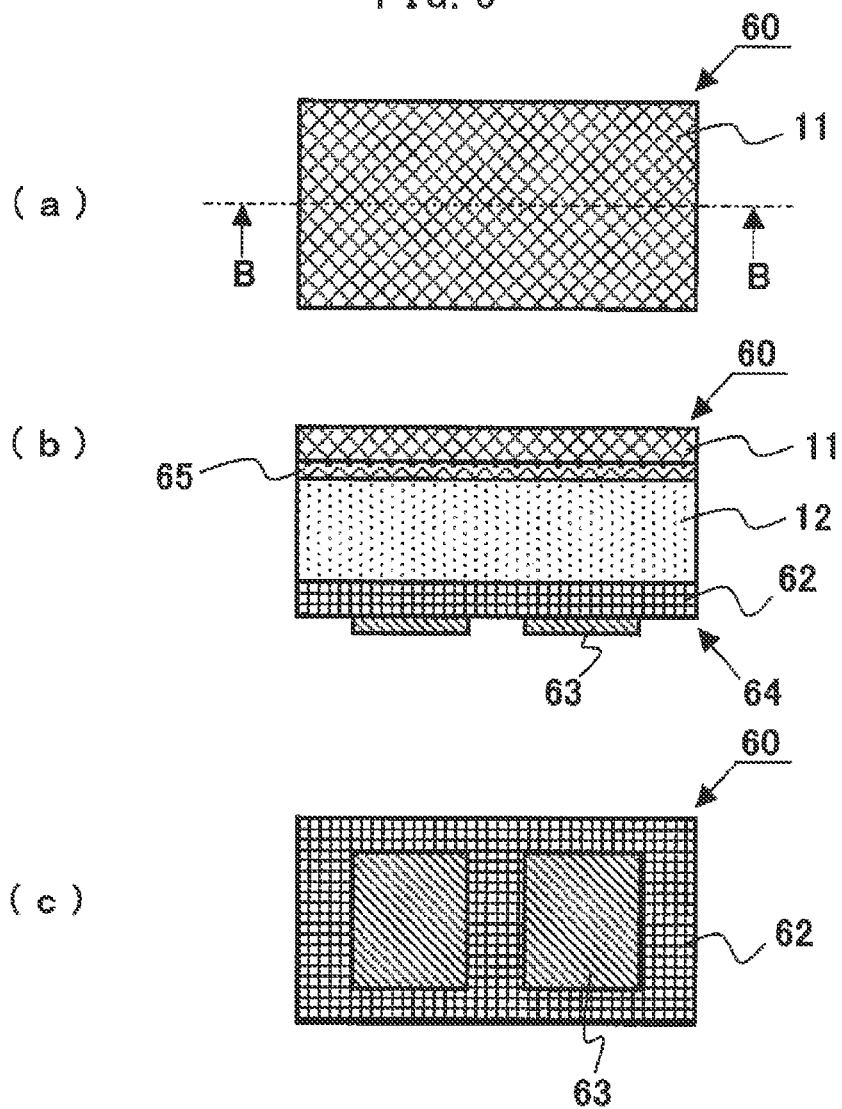
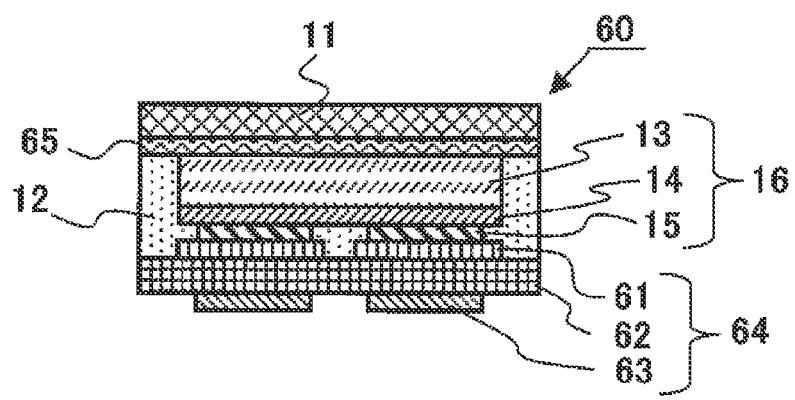

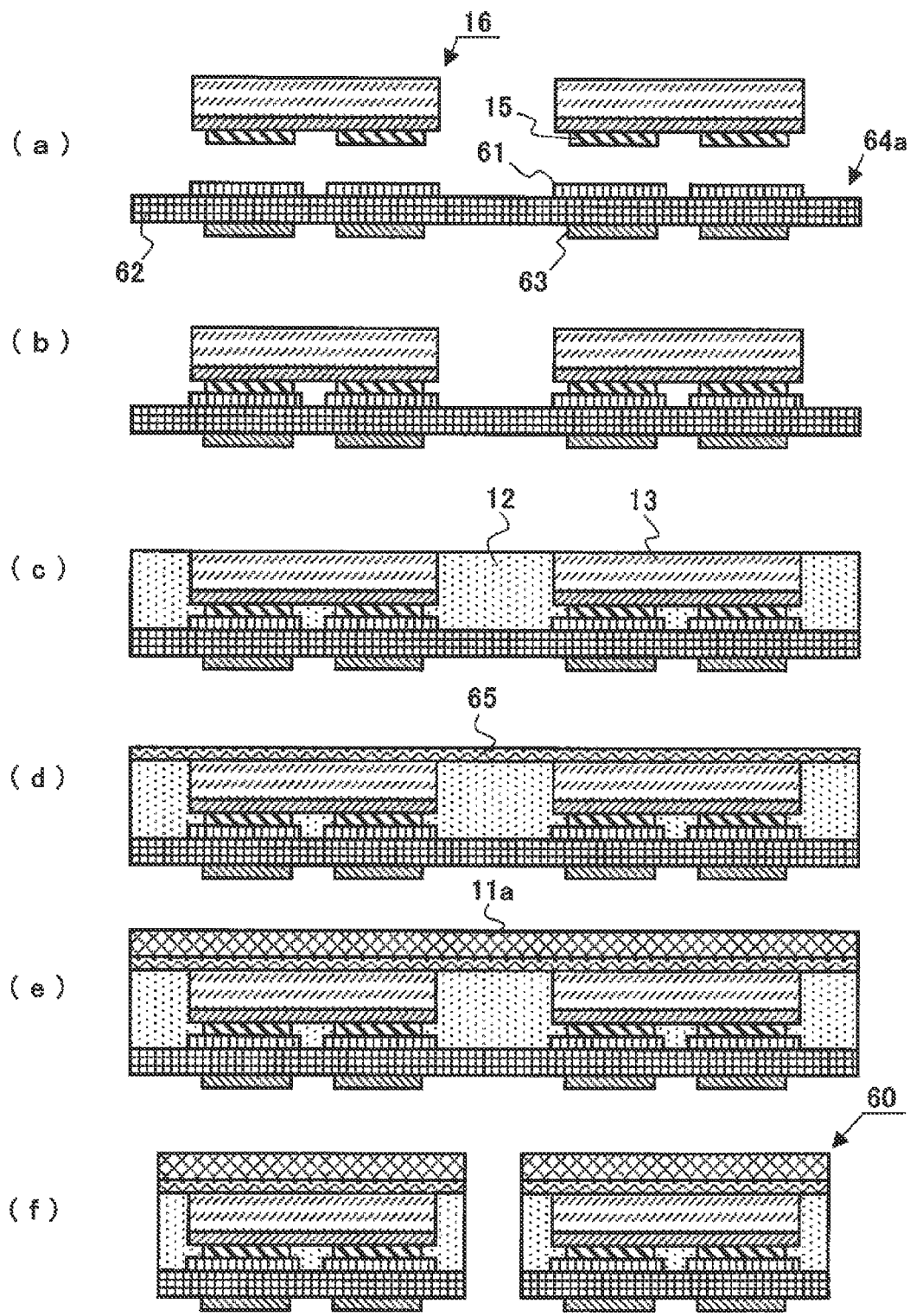

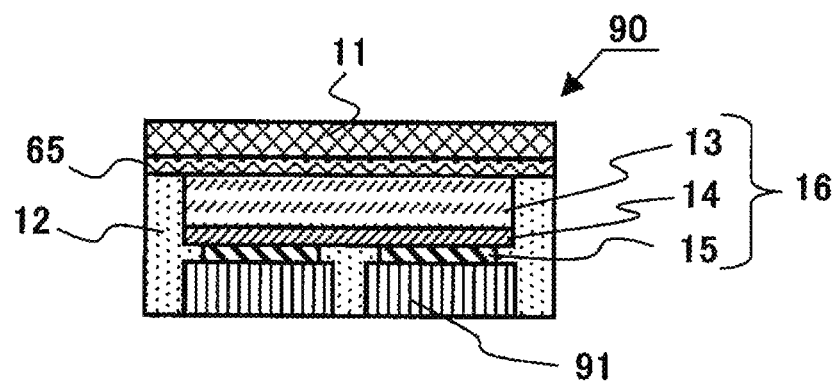
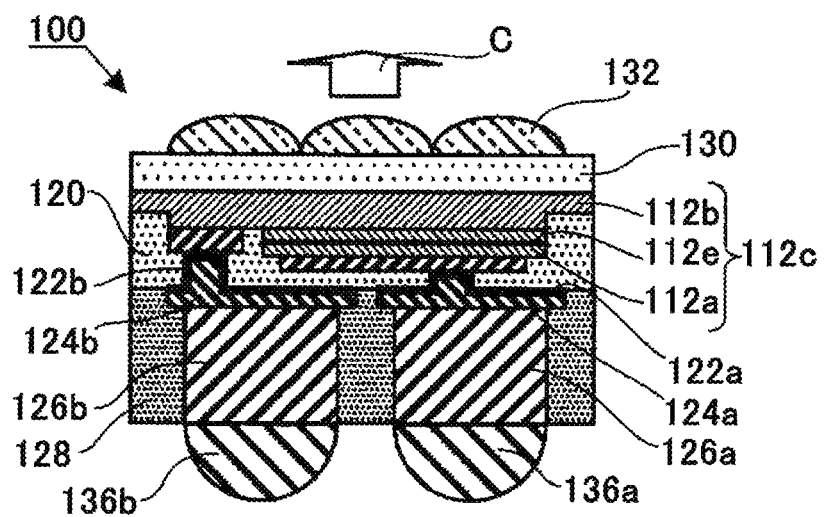

SEMICONDUCTOR LIGHT-EMITTING DEVICE AND PRODUCING METHOD THEREOF

CROSS-REFERENCES TO RELATED APPLICATION

This application is a new U.S. patent application that claims benefit of JP2012-248242, filed on Nov. 12, 2012, the entire content of JP2012-248242 is hereby incorporated by reference.

TECHNICAL FIELD

The present invention relates to a semiconductor light-emitting device that lends itself to chip size packaging, and a method for producing the same.

BACKGROUND

With an increasing demand for higher brightness, the size of semiconductor light-emitting elements (hereinafter referred to as "LED dies" unless specifically designated otherwise) has also been increasing, and light-emitting elements measuring up to 1 mm by 0.5 to 1 mm in area size are commercially available. Since this area size is about the same as that of other chip components such as resistors, there has developed a need for a semiconductor light-emitting device constructed by packaging an LED die in a resin or the like (hereinafter referred to as "LED device" unless specifically designated otherwise) to have about the same area size as the LED die. Such a package is sometimes referred to as a chip size package (hereinafter abbreviated CSP) as it directly reflects the size of the LED die. A CSP has the advantage of small mounting area and a reduced amount of packaging material, and the further advantage of being able to provide greater freedom in the design of lighting equipment, etc., because the number of components to be mounted on the mother substrate can be easily changed according to the required brightness.

FIG. 10 is a cross-sectional view of a light-emitting device 100 (LED device) implemented in CSP form according to a first prior art example.

The light-emitting device 100 shown in FIG. 10 is an ideal form of CSP in which the chip size of the LED die is identical to the outer plan shape of the package, and this LED device is disclosed in patent document 1.

In the LED device 100, a phosphor layer 130 and a lens 132 are formed one on top of the other on the upper surface of a multilayered structure 112c (of semiconductor layers). Seed metals 122a and 122b remaining unetched when a common electrode was formed by electrolytic plating, copper wiring layers 124a and 124b, and columnar copper pillars 126a and 126b formed by electrolytic plating are located on the underside of the multilayered structure 112.

The multilayered structure 112c is made up of a p-type clad layer 112b, a light-emitting layer 112e, and an n-type clad layer 112a. The lower surface of the multilayered structure 112c is covered with an insulating layer 120 having openings in designated portions. Solder balls 136a and 136b are attached to the bottoms of the respective copper pillars 126a and 126b. A reinforcing resin 128 is filled into the space separating the copper pillars 126a and 126b.

The area size of the LED device 100 shown in FIG. 10 is identical with the area size of the multilayered structure 112c. The LED device 100 is one that is diced from a wafer on which a plurality of LED devices 100 have been produced in a rectangular array; such a package is the smallest one among the group of products categorized as CSPs, and is therefore sometimes referred to as a wafer-level package (WLP). In the LED device 100, since the transparent insulating substrate initially present on the multilayered structure 112c (see FIG. 2 and paragraph 0026 in JP 2001-141176-A) has been removed, light emitted from the light-emitting layer 112e is allowed to emerge only in the upward direction (arrow C). Therefore, the phosphor layer 130 need be provided only on the upper surface of the LED device 100.

In the LED device 100 of FIG. 10, a laser is used to remove the transparent insulating substrate, but this requires large-scale producing equipment and increases the complexity of the producing process. Furthermore, since the phosphor layer 130 is formed on the LED device 100 at the wafer level, it is not possible to address variations in light emission characteristics arising among the individual LED dies produced on the wafer. This leads to the problem that it is difficult to manage the color of emission.

SUMMARY

In view of the above problem, the present inventor experimentally produced a flip-chip LED device as an LED device that is compact in size and yet easy to produce and whose color of emission is easy to manage; to achieve this, the transparent insulating substrate was left unremoved, and the side faces of the transparent insulating substrate as well as the side faces of the semiconductor layer formed on the lower surface of the transparent insulating substrate were covered with a white reflective member, while the upper surface of the transparent insulating substrate was covered with a phosphor sheet (refer to JP 2012-227470-A).

FIG. 11 is a cross-sectional view of an LED device 200 according to a second prior art example. The LED device 200 shown here is disclosed in JP 2012-227470-A.

The LED device 200 is constructed from an LED die 216b having a sapphire substrate 214b (transparent insulating substrate) and a semiconductor layer 215b formed on the lower surface thereof, and includes a phosphor sheet 211b, formed on the upper surface of the LED die 216b, for wavelength conversion of emitted light, and a white reflective member 217b formed on the side faces thereof. An adhesive layer 213b is interposed between the phosphor sheet 211b and the sapphire substrate 214b which are thus bonded together. Protruding electrodes 218b and 219b, which are connected to the semiconductor layer 215b of the LED die 216b, are an anode and a cathode, respectively, and serve as external connecting electrodes for connecting to a mother substrate. The mother substrate is the substrate on which the LED device 200 is mounted along with other electronic components such as resistors and capacitors.

Since the phosphor sheet 211b can be changed according to the light emission characteristics of the individual LED die 216b, the color of emission of the LED device 200 is easy to manage, and since the white reflective member 217b can serve the purpose if its thickness is reduced to 100 µm or less, the LED device 200 can be made compact in size. Furthermore, the LED device 200 is easy to produce, because a batch producing method can be employed in which processing is performed on a large number of LED dies 216b arranged in an array on a wafer which is eventually diced into individual LED devices 200.

In the LED device 200 of FIG. 11, the total luminous flux was about 70% of that of a comparison LED device which was produced by flip-chip mounting the LED die 216b on an evaluation circuit substrate and by covering the LED die 216b only with a phosphor resin. This shows that, in the implementation of CSP, the light emission loss must be reduced as much as possible.

An object of the present invention is to provide a semiconductor light-emitting device that can achieve a large total luminance flux while also achieving a structure that is compact in size and easy to produce and whose color of emission is easy to manage, and a method for producing such a semiconductor light-emitting device.

A semiconductor light-emitting device includes a semiconductor light-emitting element which includes a transparent insulating substrate and a semiconductor layer formed on a lower surface of the transparent insulating substrate, a phosphor resin which covers a side face of the transparent insulating substrate, and which wavelength-converts a portion of light emitted from the semiconductor light-emitting element, and a phosphor sheet which covers an upper surface of the phosphor resin and is bonded to the transparent insulating substrate, wherein the phosphor sheet has a top plan shape that is identical to an outer peripheral shape of the phosphor resin, and the top plan shape of the phosphor sheet defines an overall outer plan shape of the device.

In the semiconductor light-emitting device, the side face of the transparent insulating substrate of the semiconductor light-emitting element is covered with the phosphor resin, and the phosphor sheet is bonded to the upper surface of the transparent insulating substrate. Since the phosphor resin covering the side face can be made as thin as about 100 μm, the top plan size of the semiconductor light-emitting device can be made substantially equal to the top plan size of the semiconductor light-emitting element, and thus the presence of the phosphor resin is not an obstacle to size reduction. The semiconductor light-emitting element is enclosed around its entire periphery by the phosphor resin and, in this condition, the phosphor sheet is bonded to the transparent insulating substrate so as to also cover the upper surface of the phosphor resin. At this time, the top plan shape of the phosphor sheet and the outer peripheral shape of the phosphor resin define the outer plan shape of the semiconductor light-emitting device. As a result, a batch producing method can be employed for the producing of the semiconductor light-emitting device, which means that the semiconductor light-emitting device has a structure easy to produce. When the phosphor sheet is bonded to the upper surface of the transparent insulating substrate whose outer periphery is covered with the phosphor resin, a higher total luminous flux can be obtained than when the phosphor sheet is bonded to the upper surface of the transparent insulating substrate whose outer periphery is covered with a white reflective layer.

In the semiconductor light-emitting device, a connecting electrode for connecting to an electrode on a mother substrate may be provided on a lower surface of the semiconductor light-emitting element.

In the semiconductor light-emitting device, the semiconductor light-emitting element may be flip-chip mounted on a submount substrate or on a lead.

In the semiconductor light-emitting device, the lower surface of the semiconductor light-emitting element may be covered with the phosphor resin everywhere, except a region where the connecting electrode is formed.

In the semiconductor light-emitting device, the lower surface of the semiconductor light-emitting element may be covered with a white reflective member everywhere except a region where the connecting electrode is formed.

In the semiconductor light-emitting device, the side face of the lead and the entire lower surface of the semiconductor light-emitting element excluding a region where the connecting electrode is formed may be covered with the phosphor resin.

A method for producing a semiconductor light-emitting device that produces output light by wavelength-converting a portion of light emitted from a semiconductor light-emitting element having a transparent insulating substrate and a semiconductor layer formed on a lower surface thereof, the method includes a preparatory step for preparing a large-sized phosphor sheet made of a phosphor-containing resin formed in the shape of a sheet and a plurality of said semiconductor light-emitting elements, an element placement step for placing the semiconductor light-emitting elements on said large-sized phosphor sheet by disposing the transparent insulating substrate in contacting relationship with the large-sized phosphor sheet, and for bonding the semiconductor light-emitting elements to the large-sized phosphor sheet, a phosphor resin filling step for filling a phosphor resin containing fine phosphor particles so as to cover a side face of each of the semiconductor light-emitting elements, and a dicing step for dicing to separate the semiconductor light-emitting device by cutting the large-sized phosphor sheet and the phosphor resin together.

In the above semiconductor light-emitting device producing method, the semiconductor light-emitting elements are first placed on the large-sized phosphor sheet from which a large number of phosphor sheets are to be diced, and then bonded to the large-sized phosphor sheet. At this time, the transparent insulating substrate of each of the semiconductor light-emitting elements is disposed in contacting relationship with the large-sized phosphor sheet. Next, the phosphor resin is filled into the space between the thus placed semiconductor light-emitting elements, and finally the large-sized phosphor sheet is cut and diced to separate each desired semiconductor light-emitting device. Since the above semiconductor light-emitting device producing method can thus employ the so-called batch producing method by which a large number of semiconductor light-emitting devices can be simultaneously produced through a sequence of producing steps, the semiconductor light-emitting device of the invention is easy to produce. Further, in the semiconductor light-emitting device produced according to this method, since the phosphor resin covering the outer periphery of the semiconductor light-emitting element can be made as thin as about 100 μm, the top plan size of the semiconductor light-emitting device becomes substantially equal to the top plan size of the semiconductor light-emitting element, and thus the presence of the phosphor resin is not an obstacle to size reduction. Furthermore, the total luminous flux of the semiconductor light-emitting device produced according to the above producing method is higher than that of a semiconductor light-emitting device constructed by covering the outer periphery of the transparent insulating substrate with a white reflective resin.

A method for producing a semiconductor light-emitting device that produces output light by wavelength-converting a portion of light emitted from a semiconductor light-emitting element having a transparent insulating substrate and a semiconductor layer formed on a lower surface thereof, the method includes a preparatory step for preparing a large-sized submount substrate which becomes a submount substrate or a lead when it is to be diced or a leadframe, and a plurality of the semiconductor light-emitting elements, an element placement step for placing the semiconductor light-emitting elements on the large-sized submount substrate or the leadframe by disposing the semiconductor layer in each of the semiconductor light-emitting elements in contacting relationship with the large-sized submount substrate or said leadframe, and for bonding the semiconductor light-emitting elements to the large-sized submount substrate or the leadframe, a phosphor resin filling step for filling a phosphor resin containing fine phosphor particles so as to cover a side face of each of the semiconductor light-emitting elements, a large-sized phosphor sheet bonding step for bonding a large-sized phosphor sheet made of a resin, which contains fine phosphor particles and is formed in the shape of a sheet, to the transparent insulating substrate, and a dicing step for dicing to separate the semiconductor light-emitting device by cutting the large-sized phosphor sheet or the leadframe, the large-sized phosphor sheet, and the phosphor resin together.

In the above alternative semiconductor light-emitting device producing method, first the large-sized submount substrate or leadframe from which a large number of submount substrates or leads are to be diced is prepared together with the semiconductor light-emitting elements. Next, the semiconductor light-emitting elements are placed on the large-sized submount substrate or leadframe and are connected to it. At this time, the connecting electrode formed on the semiconductor layer in each of the semiconductor light-emitting elements is disposed in contacting relationship with the large-sized submount substrate or leadframe. Next, the phosphor resin is filled into the space between the thus placed semiconductor light-emitting elements, and finally the large-sized submount substrate or leadframe is cut and diced to separate each desired semiconductor light-emitting device. Since the above alternative semiconductor light-emitting device producing method can thus employ the so-called batch producing method by which a large number of semiconductor light-emitting devices can be simultaneously produced through a sequence of producing steps, the semiconductor light-emitting device of the invention is easy to produce. Furthermore, in the semiconductor light-emitting device produced according to this method, since the phosphor resin covering the outer periphery of the semiconductor light-emitting element can be made as thin as about 100 μm, the top plan size of the semiconductor light-emitting device can be made substantially equal to the top plan size of the semiconductor light-emitting element, and thus the presence of the phosphor resin is not an obstacle to size reduction. Further, since the semiconductor light-emitting elements to be placed on the large-sized submount substrate or leadframe can be chosen to have substantially identical light emission characteristics, and the phosphor sheet that matches the light emission characteristics can be selected, it is easy to manage the color of emission of the semiconductor light-emitting device. Furthermore, the total luminous flux of the semiconductor light-emitting device produced according to the above producing method is higher than that of the semiconductor light-emitting device constructed by covering the outer periphery of the transparent insulating substrate with a white reflective resin.

According to the semiconductor light-emitting device, since the phosphor resin can be formed as thin as 100 μm, the presence of the phosphor resin is not an obstacle to size reduction, and since the structure is such that the upper surface of the phosphor resin as well as the upper surface of the transparent insulating substrate is covered with the phosphor sheet, the structure is easy to produced because the batch producing method can be employed. Furthermore, the total luminous flux of the semiconductor light-emitting device is higher than that of the semiconductor light-emitting device constructed by covering the outer periphery of the transparent insulating substrate with a white reflective resin. In this way, according to the semiconductor light-emitting device of the invention, a high total luminous flux can be obtained while retaining the structure that is compact in size and easy to produce.

According to the semiconductor light-emitting device producing method, since the so-called batch producing method can be employed, a large number of semiconductor light-emitting devices can be simultaneously produced through a sequence of producing steps, and since the phosphor resin can be formed as thin as 100 μm, the presence of the phosphor resin is not an obstacle to size reduction. Further, since the semiconductor light-emitting elements to be produced by the batch producing method can be chosen to have substantially identical characteristics, it is easy to manage the color of emission of the semiconductor light-emitting device. Furthermore, the total luminous flux of the semiconductor light-emitting device is higher than that of the semiconductor light-emitting device constructed by covering the outer periphery of the transparent insulating substrate with a white reflective resin. In this way, according to the semiconductor light-emitting device producing method of the invention, a semiconductor light-emitting device can be produced that can achieve a high total luminous flux while retaining the structure that is compact in size and easy to produce and whose color emission is easy to manage.

BRIEF DESCRIPTION OF THE DRAWINGS

Other features and advantages of the present invention will be apparent from the ensuing description, taken in conjunction with the accompanying drawings, in which:

FIGS. 6(a) to 6(c) are diagrams showing the external appearance of a still further alternative LED device 60;

FIG. 7 is a cross-sectional view taken along line BB' in FIG. 6(a);

FIGS. 8(a) to 8(f) are diagrams for explaining the producing process of the LED device 60;

FIG. 9 is a cross-sectional view of a yet further alternative LED device 90;

FIG. 10 is a cross-sectional view of an LED device according to a first prior art example.

DESCRIPTION

Figure 1:
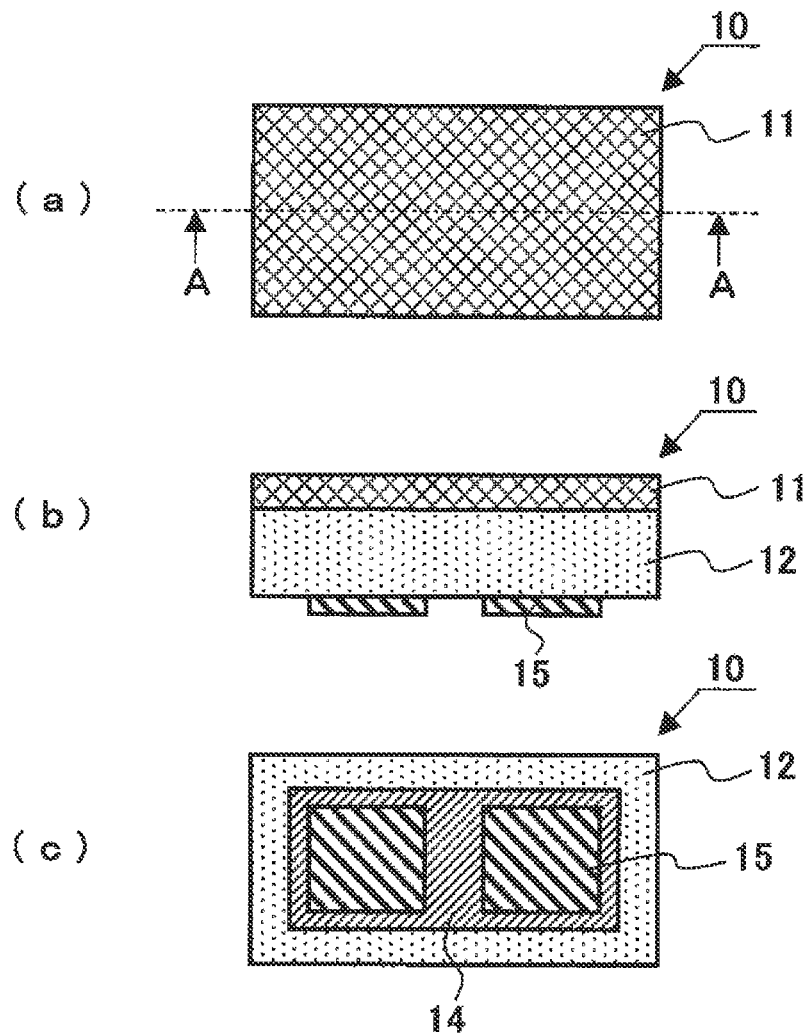
FIGS. 1(a) to 1(c) are diagrams showing the external appearance of an LED device 10.

A semiconductor light-emitting device and a method for producing the same will be described below with reference to the drawings. It will, however, be noted that the technical scope of the present invention is not limited by any particular embodiment described herein but extends to the inventions described in the appended claims and their equivalents. Further, in the description of the drawings, the same or corresponding component elements are designated by the same reference numerals, and the description of such component elements, once given, will not be repeated thereafter.

FIG. 1 shows the external appearance of an LED device 10; more specifically, FIG. 1(a) shows a plan view, FIG. 1(b) shows a front view, and FIG. 1(c) shows a bottom view.

As shown in FIG. 1(a), when the LED device 10 is viewed from the top, only a rectangular phosphor sheet 11 is seen. As shown in FIG. 1(b), when the LED device 10 is viewed from the front, there is seen a phosphor resin 12 located under the phosphor sheet 11, and there are also seen two connecting electrodes 15 formed on the underside of the phosphor resin 12. As shown in FIG. 1(c), when the LED device 10 is viewed from the bottom, the phosphor resin 12 surrounding a semiconductor layer 14 and the two connecting electrodes 15 formed in regions surrounded by the semiconductor layer 14 are seen. As shown, in the LED device 10, the phosphor sheet 11 has a top plan shape that is identical with the outer peripheral shape of the phosphor resin 12, and the top plan shape of the phosphor sheet 11 defines the overall outer plan shape of the LED device 10.

Figure 2:
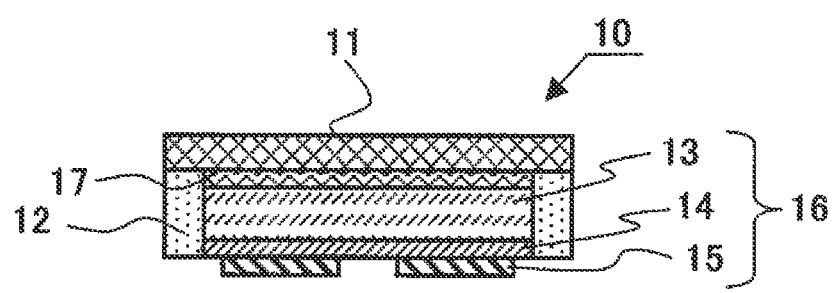
FIG. 2 is a cross-sectional view taken along line AA' in FIG. 1.

FIG. 2 is a cross-sectional view taken along line AA' in FIG. 1.

As shown in FIG. 2, in the LED device 10, the side faces of an LED die 16 (semiconductor light-emitting element) are covered with the phosphor resin 12, and the upper surface of the LED die 16 and the upper surface of the phosphor resin 12 are covered with the phosphor sheet 11. The LED die 16 includes a sapphire substrate 13 (transparent insulating substrate) in addition to the semiconductor layer 14 and the two connecting electrodes 15, and the semiconductor layer 14 and the sapphire substrate 13 are located one on top of the other above the connecting electrodes 15. An adhesive member 17 is interposed between the sapphire substrate 13 and the phosphor sheet 11.

The phosphor sheet 11 is formed by mixing fine phosphor particles into a phenyl-based silicone resin and kneading the mixture into the shape of a sheet, and has a thickness of about 100 to 300 μm. If it is desired to reduce loss due to concentration quenching, the phosphor sheet 11 should be formed thicker. Similarly, the phosphor resin 12 is formed by mixing fine phosphor particles into a silicone resin, kneading the mixture, and thermosetting the resin, and has a width of about 100 μm. The adhesive member 17 is also a thermosetting silicone adhesive material, and has a thickness of about 100 μm. As a result, if the bottom face of the LED die 16 measures 0.8 mm×0.3 mm, then the area size of the LED device 10 is 1.0 mm×0.5 mm, thus making the overall size easy to handle by a surface mounter.

The phosphor sheet 11 and the phosphor resin 12 both have the function of wavelength-converting the blue light of the LED die 16 into white light. The phosphor resin 12 is often made thinner than the phosphor sheet 11; if this is the case, the phosphor concentration in the phosphor resin 12 should be made higher than the phosphor concentration in the phosphor sheet 11.

The sapphire substrate 13 of the LED die 16 is about 80 to 120 μm in thickness. The semiconductor layer 14 formed on the lower surface of the sapphire substrate 13 is about 10 μm in thickness and includes a p-type semiconductor layer and an n-type semiconductor layer, and the junction between them serves as the light-emitting layer. An interlayer insulating film and a protective film are formed on the underside of the semiconductor layer 14, and the connecting electrodes 15 are formed on the protective film. The two connecting electrodes 15 are an anode and a cathode, respectively, and are connected to the p-type semiconductor layer and the n-type semiconductor layer via interconnections formed on the interlayer insulating film. The connecting electrodes 15 serve as external connecting electrodes for connecting to a mother substrate on which other electronic components such as resistors and capacitors are mounted, and each electrode has a gold layer on its surface for soldering.

Figure 3:
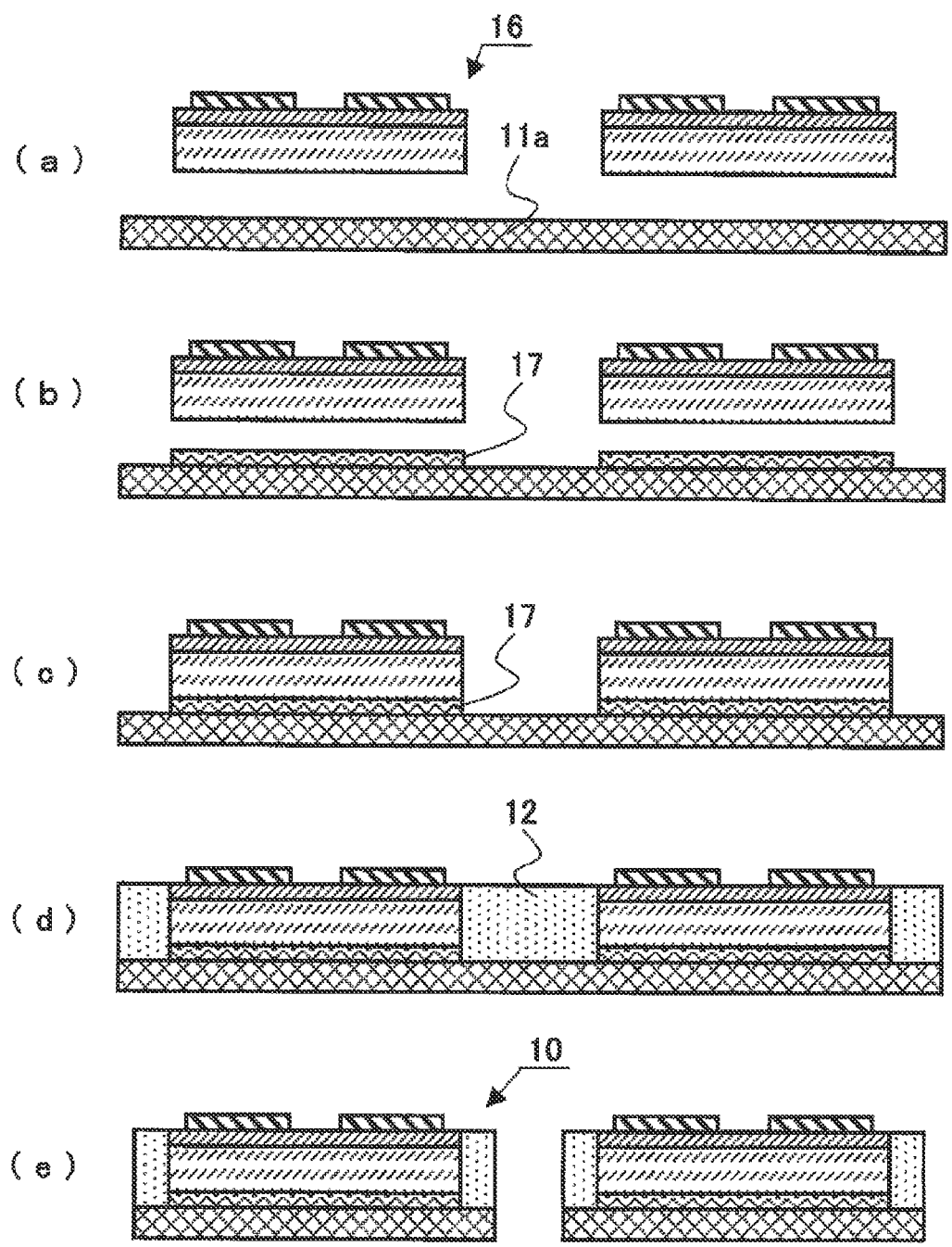
FIGS. 3(a) to 3(e) are diagrams for explaining a method for producing the LED device 10.

FIG. 3 is a diagram for explaining the producing process of the LED device 10.

First, in the preparatory step shown in FIG. 3(a), a large-sized phosphor sheet 11a and LED dies 16 are prepared. Each LED die 16 is chosen to have light emission characteristics that match the wavelength conversion characteristics of the phosphor sheet 11 in order to achieve desired color emission. The large-sized phosphor sheet 11a is eventually diced into a large number of phosphor sheets 11 (see FIGS. 1 and 2). Several hundred to several thousand LED dies 16 are actually attached to the large-sized phosphor sheet 11a, but in FIG. 3(a), only two LED dies 16 are shown (the same applies hereinafter). The large-sized phosphor sheet 11a is thin and is therefore placed on a supporting base which is not shown here (the same applies hereinafter). Since the processing in each of the steps shown in FIGS. 3(a) to 3(e) is performed only on one side of the large-sized phosphor sheet 11a by making use of gravity, the diagram is shown upside-down from that depicted in FIG. 1.

Next, in the die placement step (1) shown in FIG. 3(b), the adhesive member 17 is applied over designated portions of the large-sized phosphor sheet 11a. The adhesive member 17 may be applied by printing, and the size of each designated portion over which the adhesive member 17 is applied is made the same as the area size of the LED die 16. Alternatively, the adhesive member 17 may be applied over the sapphire substrate 13 (see FIG. 2) of each LED die 16. In that case, when the LED die 16 is picked up by a picker (or a sorter), the adhesive member is applied to the LED die 16 which is then bonded to the large-sized phosphor sheet 11a.

In the die placement step (2) shown in FIG. 3(c), each LED die 16 with its sapphire substrate 13 (see FIG. 2) face down is bonded to the large-sized phosphor sheet 11a. The LED dies 16 may be placed one by one on the large-sized phosphor sheet 11a by a picker or the like. Alternatively, the plurality of LED dies 16 may be first placed on some other suitable adhesive sheet which may then be laminated to the large-sized phosphor sheet 11a. After the LED dies 16 have been placed on the large-sized phosphor sheet 11a, the adhesive member 17 is cured by heating. The curing here may be tentative curing in which the crosslinking is incomplete.

Next, in the phosphor resin filling step shown in FIG. 3(d), the phosphor resin 12 is filled so as to cover the side faces of each LED die 16, and then the phosphor resin 12 is cured by heating. Prior to the resin filling, a dam member not shown is formed so as to surround the outer periphery of the large-sized phosphor sheet 11a, and the accurately measured phosphor resin 12 before curing is dispensed using a dispenser. If the connecting electrodes 15 are set thicker in advance, the phosphor resin 12 may be allowed to somewhat cover the semiconductor layer 14 (see FIG. 1) without any problem. Further, since the semiconductor layer 14 is covered with a protective film, a slightly smaller amount of filling can be tolerated.

Finally, in the dicing step shown in FIG. 3(e), the large-sized phosphor sheet 11a and the phosphor resin 12 are together cut and diced into individual LED devices 10. A dicer is used for cutting. Prior to cutting, the large-sized phosphor sheet 11a is transferred from the earlier mentioned supporting base onto a dicing tape. In the cutting step, each individual LED device 10 may be electrically and optically tested on the large-sized sheet before dicing, because the device failure rate can then be reduced.

Figure 11:
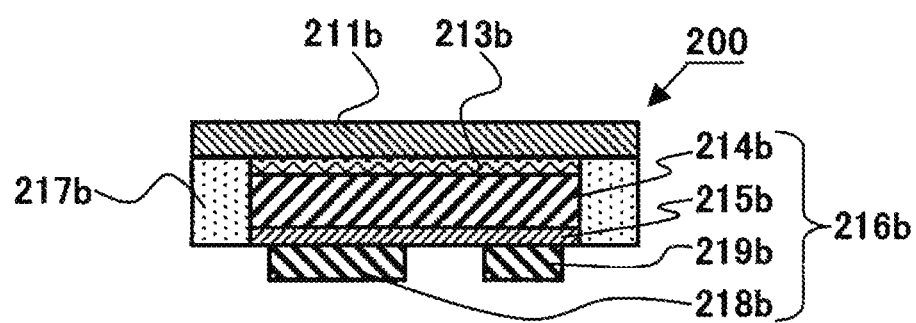
FIG. 11 is a cross-sectional view of an LED device according to a second example.

The total luminous flux of the LED device 10 thus produced was measured using an integrating sphere and compared with the total luminous flux measured of the LED device 200 constructed by covering the side faces of the LED die 216b (see FIG. 11) with the white reflective member 217b (see FIG. 11) and attaching the phosphor sheet 211b (see FIG. 11) to the upper surface thereof. When the LED device 200 and the LED device 10 were each cause to light by flowing a current of 65 mA, the total luminous flux measured of the LED device 200 was 23.0 lm, while on the other hand, the total luminous flux measured of the LED device 10 was 26.5 lm. The phosphor sheets 11, 211b and the LED dies 16, 216b are respectively the same for both the LED 10 and the LED 200.

Figure 4:
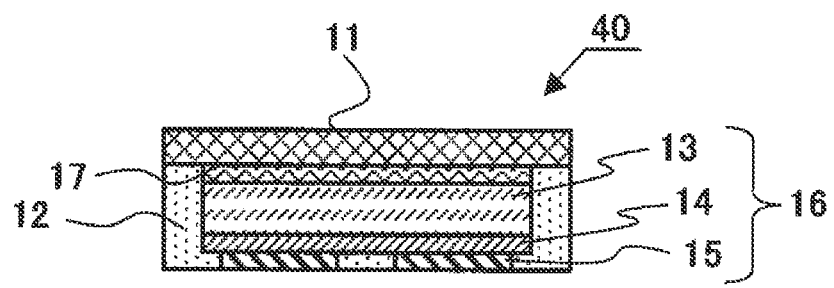
FIG. 4 is a cross-sectional view of an alternative LED device 40.

FIG. 4 is a cross-sectional view of an alternative LED device 40.

As has been shown in FIGS. 1 to 3, the semiconductor layer 14 is exposed in the bottom face of the LED device 10. However, the semiconductor layer 14 may not be exposed. The LED device 40 shown in FIG. 4 has a structure in which the semiconductor layer 14 is not exposed in the bottom face. The only difference between the LED device 40 shown in FIG. 4 and the LED device 10 shown in FIG. 2 is that, in the LED device 40, the phosphor resin 12 is formed so as to also cover the semiconductor layer 14 in the bottom face, everywhere except the regions where the connecting electrodes 15 are formed.

The LED 40 can be produced by filling a slightly larger amount of phosphor resin 12 in the phosphor resin filling step of FIG. 3(d) and, after curing the phosphor resin 12, polishing the upper surface of the phosphor resin 12 to expose the connecting electrodes 15. The presence of the phosphor resin 12 on the bottom face of the LED device 40 serves to protect the semiconductor layer 14 from contamination on the bottom face; furthermore, since the blue light leaking through the periphery of the semiconductor layer 14 can also be wavelength-converted, the light-emission efficiency can be enhanced. In addition, if the LED device 40 is mounted on a transparent mother substrate, a light-emitting module that emits light from both sides of the mother substrate can be achieved.

Figure 5:
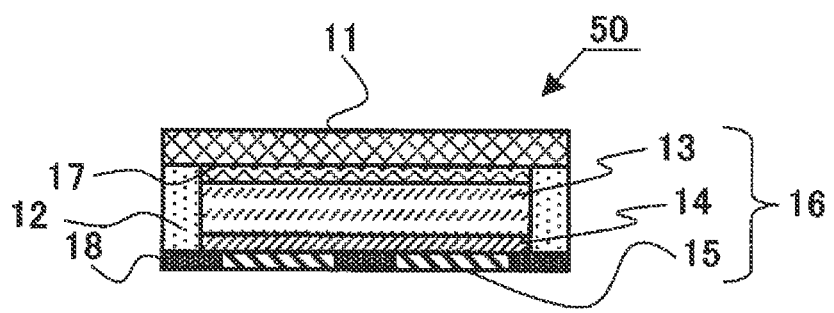
FIG. 5 is a cross-sectional view of a further alternative LED device 50.

FIG. 5 is a cross-sectional view of a further alternative LED device 50.

The LED device 50 shown in FIG. 5 also has a structure in which the semiconductor layer 14 is not exposed in the bottom face. The only difference between the LED device 50 shown in FIG. 5 and the LED device 10 shown in FIG. 2 is that, in the LED device 50, a white reflective member 18 is formed so as to cover the semiconductor layer 14 in the bottom face, everywhere except the regions where the connecting electrodes 15 are formed.

The LED 50 can be produced by applying the white reflective member 18 after filling and curing the phosphor resin 12 in the phosphor resin filling step of FIG. 3(d) and, after curing the white reflective member 18, polishing the upper face of the white reflective member 18 to expose the connecting electrodes 15. Similarly to the case of the LED device 40, the presence of the white reflective member 18 on the bottom face of the LED device 50 serves to protect the semiconductor layer 14 from contamination on the bottom face; furthermore, since the blue light leaking through the periphery of the semiconductor layer 14 can be reflected, the light-emission efficiency can be enhanced. The white reflective member 18 is formed by mixing fine reflective particles such as titanium oxide or alumina into a binder such as a silicone resin or organopolysiloxane and kneading the mixture, and is cured by heating.

FIG. 6 shows the external appearance of a still further alternative LED device 60; more specifically, FIG. 6(a) shows a plan view, FIG. 6(b) shows a front view, and FIG. 6(c) shows a bottom view.

In the LED devices 10, 40, and 50, the connecting electrodes 15 are formed as external connecting electrodes on the bottom face of the LED die 16 (see FIGS. 2, 4, and 5). However, the LED device need not be limited to the structure in which the external connecting electrodes are provided on the bottom face of the LED die 16, but the LED die 16 may be mounted on a submount substrate or a leadframe, as is well known in semiconductor device packaging. In the LED device 60, the LED die 16 is mounted on a submount substrate 64.

As shown in FIG. 6(a), when the LED device 60 is viewed from the top, only the rectangular phosphor sheet 11 is seen. As shown in FIG. 6(b), when the LED device 60 is viewed from the front, the adhesive member 65, phosphor resin 12, and submount substrate 64 located under the phosphor sheet 11 are seen. The submount substrate 64 has two connecting electrodes 63 formed on a base substrate 62. As shown in FIG. 6(c), when the LED device 60 is viewed from the bottom, the two connecting electrodes 63 surrounded by the base substrate 62 are seen. As shown, in the LED device 60, as in the LED device 10, etc., the phosphor sheet 11 has a top plan shape that is identical with the outer peripheral shape of the phosphor resin 12, and the top plan shape of the phosphor sheet 11 defines the overall outer plan shape of the LED device 60.

FIG. 7 is a cross-sectional view taken along line BB' in FIG. 6(a).

In the LED device 60, the side and bottom faces of the LED die 16 are covered with the phosphor resin 12, and the upper surface of the LED die 16 and the upper surface of the phosphor resin 12 are bonded to the phosphor sheet 11 by means of the adhesive member 65. The LED die 16 is flip-chip mounted on the submount substrate 64. The submount substrate 64 is provided with connecting electrodes 61 and 63 formed on the upper and lower surfaces of the base substrate 62; the connecting electrodes 61 are connected to the connecting electrodes 15 formed on the LED die 16, and the connecting electrodes 63 serve as external connecting electrodes. Considering the cost, thermal conductivity, etc., the base substrate 62 is formed from a material, selected from among a metal plate, a ceramic plate, and a resin plate, that can maintain electrical insulation from connecting members, such as the connecting electrodes 61 and 63, by an insulating layer formed, for example, on the surface thereof. The connecting electrodes 61 are connected to the connecting electrodes 15 by a high-melting solder in order to prevent the connections from melting when mounting the LED device 60 on the mother substrate.

FIG. 8 is a diagram for explaining the producing process of the LED device 60.

First, in the preparatory step shown in FIG. 8(a), a large-sized submount substrate 64a and LED dies 16 are prepared. The LED dies 16 are chosen to have substantially identical light emission characteristics. The large-sized submount substrate 64a is eventually diced into a large number of submount substrates 64 (see FIGS. 6 and 7). Several hundred to several thousand LED dies 16 are actually connected to the large-sized submount substrate 64a, but in FIG. 8(a), only two LED dies 16 are shown (the same applies hereinafter). The large-sized submount substrate 64a is placed on a supporting base which is not shown here (the same applies hereinafter).

Next, in the die placement step shown in FIG. 8(b), the LED dies 16 are placed on the large-sized submount substrate 64a by disposing the connecting electrodes 15 of each LED die 16 in contacting relationship with the corresponding connecting electrodes 61 formed on the large-sized submount substrate 64a; the connecting electrodes 15 are subsequently permanently connected to the connecting electrodes 61 by heating. The LED dies 16 may be placed one by one on the large-sized submount substrate 64a by a picker or the like. Alternatively, the plurality of LED dies 16 may be first placed on some other suitable adhesive sheet, and may then be placed onto the large-sized submount substrate 64a at one time.

Next, in the phosphor resin filling step shown in FIG. 8(c), the phosphor resin 12 is filled so as to cover the side faces of each LED die 16, and then the phosphor resin 12 is cured by heating. Prior to the resin filling, a dam member not shown is formed so as to surround the outer periphery of the large-sized submount substrate 64a, and the accurately measured phosphor resin 12 before curing is dispensed using a dispenser. If a method that dispenses a slightly larger amount of phosphor resin 12 is employed, or if a squeegee method is employed to apply the phosphor resin 12, then after filling and curing the phosphor resin 12 the upper surface of the phosphor resin 12 may be polished to expose the upper surface of the sapphire substrate 13.

Next, in the large-sized phosphor sheet bonding step (1) shown in FIG. 8(d), the adhesive member 65 is applied over the entire upper surface of the sapphire substrate 13 and the phosphor resin 12.

In the large-sized phosphor sheet bonding step (2) shown in FIG. 8(e), a large-sized phosphor sheet 11a is bonded. The large-sized phosphor sheet 11a is chosen to have wavelength conversion characteristics that match the light emission characteristics of the LED dies 16 in order to achieve desired color emission.

Finally, in the dicing step shown in FIG. 8(f), the large-sized phosphor sheet 11a and the large-sized submount substrate 64a with the phosphor resin 12 sandwiched therebetween are together cut and diced into individual LED devices 60. A dicer is used for cutting. Prior to cutting, the large-sized submount substrate 64a is transferred from the earlier mentioned supporting base onto a dicing tape. In the cutting step, each individual LED device 60 may be electrically and optically tested on the large-sized substrate before dicing, and therefore the device failure rate can then be reduced.

FIG. 9 is a cross-sectional view of a yet further alternative LED device 90.

In the LED device 60 shown in FIGS. 6 to 8, the LED die 16 is flip-chip mounted on the submount substrate 64. However, the LED device need not be limited to the structure in which the LED die 16 is mounted on the submount substrate 64, but the LED die 16 may be mounted on a leadframe or on leads. In the LED device 90, the LED die 16 is flip-chip mounted on leads 91.

In the LED device 90, the side and bottom faces of the LED die 16 and the side faces of the leads 91 are covered with the phosphor resin 12, and the upper surface of the LED die 16 and the upper surface of the phosphor resin 12 are bonded to the phosphor sheet 11 by means of the adhesive member 65. The LED die 16 is flip-chip mounted on the leads 91. The leads 91 are obtained by dicing a large-sized leadframe; the upper face of each lead is connected to a corresponding one of the connecting electrodes 16 of the LED die 16, and the lower face serves as an external connecting electrode. Similarly to the case of the LED device 60, the leads 91 are connected to the connecting electrodes 15 by a high-melting solder in order to prevent the connections from melting when mounting the LED device 90 on the mother substrate.

The producing process of the LED device 90 is substantially the same as that of the LED device 60 shown in FIG. 8, except that the large-sized submount substrate 64a is replaced by a large-sized leadframe. Since the large-sized leadframe has openings, the phosphor resin 12 may be filled by placing the large-sized leadframe on a sheet or may be filled by using a mold. If the phosphor resin 12 remains adhering to the upper surface of the sapphire substrate 13 or to the lower faces of the leads 91, such unwanted portions of the phosphor resin 12 should be removed by polishing.

In the LED device 90, the presence of the phosphor resin 12 that covers the bottom face of the LED die 16 and the side faces of the leads 91 serves not only to protect the semiconductor layer 14 from contamination on the bottom face of the LED device 90, but also to relieve the stress acting on the LED device 90 from the mother substrate toward the LED die 16. Further, since the blue light leaking through the periphery of the semiconductor layer 14 can also be wavelength-converted, the light-emission efficiency can be enhanced. Furthermore, as in the LED device 40, the LED device 90 also allows effective use of the light emerging from the bottom face.

The preceding description has been presented only to illustrate and describe exemplary embodiments of the present invention. It is not intended to be exhaustive or to limit the invention to any precise form disclosed. It will be understood by those skilled in the art that various changes may be made and equivalent may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

DESCRIPTION OF THE REFERENCE NUMERALS 10, 40, 50, 60, 90 . . . LED Device (Semiconductor Light-Emitting Device)
11 . . . Phosphor Sheet
11a . . . Large-Sized Phosphor Sheet
12 . . . Phosphor Resin
13 . . . Sapphire Substrate (Transparent Insulating Substrate)
14 . . . Semiconductor Layer
15, 61, 63 . . . Connecting Electrode
16 . . . LED Die (Semiconductor Light-Emitting Element)
17, 65 . . . Adhesive Member
18 . . . White Reflective Member
62 . . . Base Substrate
64 . . . Submount Substrate
64a . . . Large-Sized Submount Substrate
91 . . . Lead

What is claimed is:
1. A semiconductor light-emitting device comprising:
a semiconductor light-emitting element which includes a transparent insulating substrate and a semiconductor layer formed on a lower surface of said transparent insulating substrate;

a phosphor resin which covers a side face of said transparent insulating substrate, and which wavelength-converts a portion of light emitted from said semiconductor light-emitting element; and a phosphor sheet which covers an upper surface of said phosphor resin and is bonded to said transparent insulating substrate, wherein said phosphor sheet has a top plan shape that is identical with an outer peripheral shape of said phosphor resin, and the top plan shape of said phosphor sheet defines an overall outer plan shape of said device.

2. The semiconductor light-emitting device according to claim 1, further comprising a connecting electrode, formed on a lower surface of said semiconductor light-emitting element, for connecting to an electrode formed on a mother substrate.

3. The semiconductor light-emitting device according to claim 1, wherein said semiconductor light-emitting element is flip-chip mounted on a submount substrate.

4. The semiconductor light-emitting device according to claim 1, wherein said semiconductor light-emitting element is flip-chip mounted on a lead.

5. The semiconductor light-emitting device according to claim 2, wherein the lower surface of said semiconductor light-emitting element is covered with said phosphor resin everywhere except a region where said connecting electrode is formed.

6. The semiconductor light-emitting device according to claim 2, wherein the lower surface of said semiconductor light-emitting element is covered with a white reflective member everywhere except a region where said connecting electrode is formed.

7. The semiconductor light-emitting device according to claim 4, wherein a side face of said lead and an entire lower surface of said semiconductor light-emitting element excluding a region where said connecting electrode is formed are covered with said phosphor resin.

* * * * *